United States Patent
Watanabe

(10) Patent No.: US 10,222,700 B2
(45) Date of Patent: Mar. 5, 2019

(54) METHOD FOR FORMING PATTERN AND METHOD FOR PRODUCING DEVICE

(71) Applicant: NIKON CORPORATION, Tokyo (JP)

(72) Inventor: Yoji Watanabe, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/943,957

(22) Filed: Apr. 3, 2018

(65) Prior Publication Data

US 2018/0224745 A1 Aug. 9, 2018

Related U.S. Application Data

(63) Continuation of application No. 14/436,987, filed as application No. PCT/JP2013/078243 on Oct. 17, 2013, now Pat. No. 9,946,160.

(30) Foreign Application Priority Data

Oct. 19, 2012 (JP) ................. 2012-231484

(51) Int. Cl.
G01B 11/00 (2006.01)
G03F 7/20 (2006.01)
G03F 7/00 (2006.01)

(52) U.S. Cl.
CPC .............. *G03F 7/70* (2013.01); *G03F 7/0035* (2013.01); *G03F 7/70466* (2013.01)

(58) Field of Classification Search
CPC . G03F 7/0035; G03F 7/70; G03F 7/40; G03F 7/0002; G03F 7/20; G03F 7/095;
(Continued)

(56) References Cited

U.S. PATENT DOCUMENTS 5,448,332 A 9/1995 Sakakibara et al.
2003/0025890 A1 2/2003 Nishinaga
(Continued)

FOREIGN PATENT DOCUMENTS

JP H05-160077 A 6/1993
JP H08-264510 A 10/1996
(Continued)

OTHER PUBLICATIONS

Hazelton et al., "Double Patterning Requirements for Optical Lithography and Prospects for Optical Extension Without Double Patterning," Proc. of SPIE, vol. 6924, pp. 69240R-1 thru 69240R-13.
(Continued)

*Primary Examiner* — Mesfin T Asfaw
(74) *Attorney, Agent, or Firm* — Oliff PLC

(57) ABSTRACT

A device manufacturing method includes forming, in a first layer, first line patterns of which longitudinal direction is a first direction; and forming, in a second layer above the first layer, second line patterns of which longitudinal direction is a second direction crossing the first direction, and third line patterns of which longitudinal direction is the second direction and having a etching characteristic different from an etching characteristic of the second line patterns. At least one edge portion of each of the second line patterns and at least one edge portion of each of the third line patterns are adjacent. As viewed from above the second layer, the adjacent at least one edge portions of one of the second and third line patterns are positioned between two adjacent line patterns of the first line pattern.

17 Claims, 13 Drawing Sheets

(58) Field of Classification Search
CPC ... G03F 7/38; G03F 7/405; G03F 7/16; G03F 7/2022; G03F 7/70466; G03F 7/094; G03F 7/70633; G03F 1/144; G03F 7/0041; G03F 7/11; G03F 7/162; G03F 7/168; G03F 7/26; H01L 21/03
See application file for complete search history.

(56) References Cited

U.S. PATENT DOCUMENTS

| | | |
|---|---|---|
| 2007/0242247 A1 | 10/2007 | Shiraishi |
| 2009/0189306 A1 | 7/2009 | Terasaki et al. |
| 2009/0317748 A1 | 12/2009 | Choi |
| 2010/0047720 A1 | 2/2010 | Yoshino |
| 2012/0225388 A1 | 9/2012 | Umatate et al. |

FOREIGN PATENT DOCUMENTS

| | | | |
|---|---|---|---|
| JP | 2010-050384 A | 3/2010 | |
| JP | 2012-064939 A | 3/2012 | |

OTHER PUBLICATIONS

Ooki et al., "Experimental Study of Non-Linear Multiple Exposure Method," SPIE, vol. 3051, pp. 85-93.

Jung et al., "Patterning with Amorphous Carbon Spacer for Expanding the Resolution Limit of Current Lithography Tool," Proc. of SPIE, vol. 6520, pp. 65201C-1 thru 65201C-9.

Jan. 21, 2014 International Search Report issued in International Application No. PCT/JP2013/078243.

Jan. 21, 2014 Written Opinion issued in International Application No. PCT/JP2013/078243.

Aug. 11, 2016 Office Action issued in U.S. Appl. No. 14/436,987.

Feb. 7, 2017 Office Action issued in Taiwanese Application No. 102137665.

Mar. 21, 2017 Office Action issued in Korean Application No. 10-2015-7013020.

Sep. 29, 2017 Office Action issued in Japanese Application No. 2014-542184.

Jan. 22, 2018 Office Action issued in Korean Application No. 10-2015-7013020.

Feb. 27, 2017 Notice of Allowance issued in U.S. Appl. No. 14/436,987.

Jun. 28, 2017 Notice of Allowance issued in U.S. Appl. No. 14/436,987.

Dec. 19, 2017 Notice of Allowance issued in U.S. Appl. No. 14/436,987.

Jul. 2, 2018 Office Action issued in Korean Application No. 10-2018-7009834.

Fig. 3 (continued page)
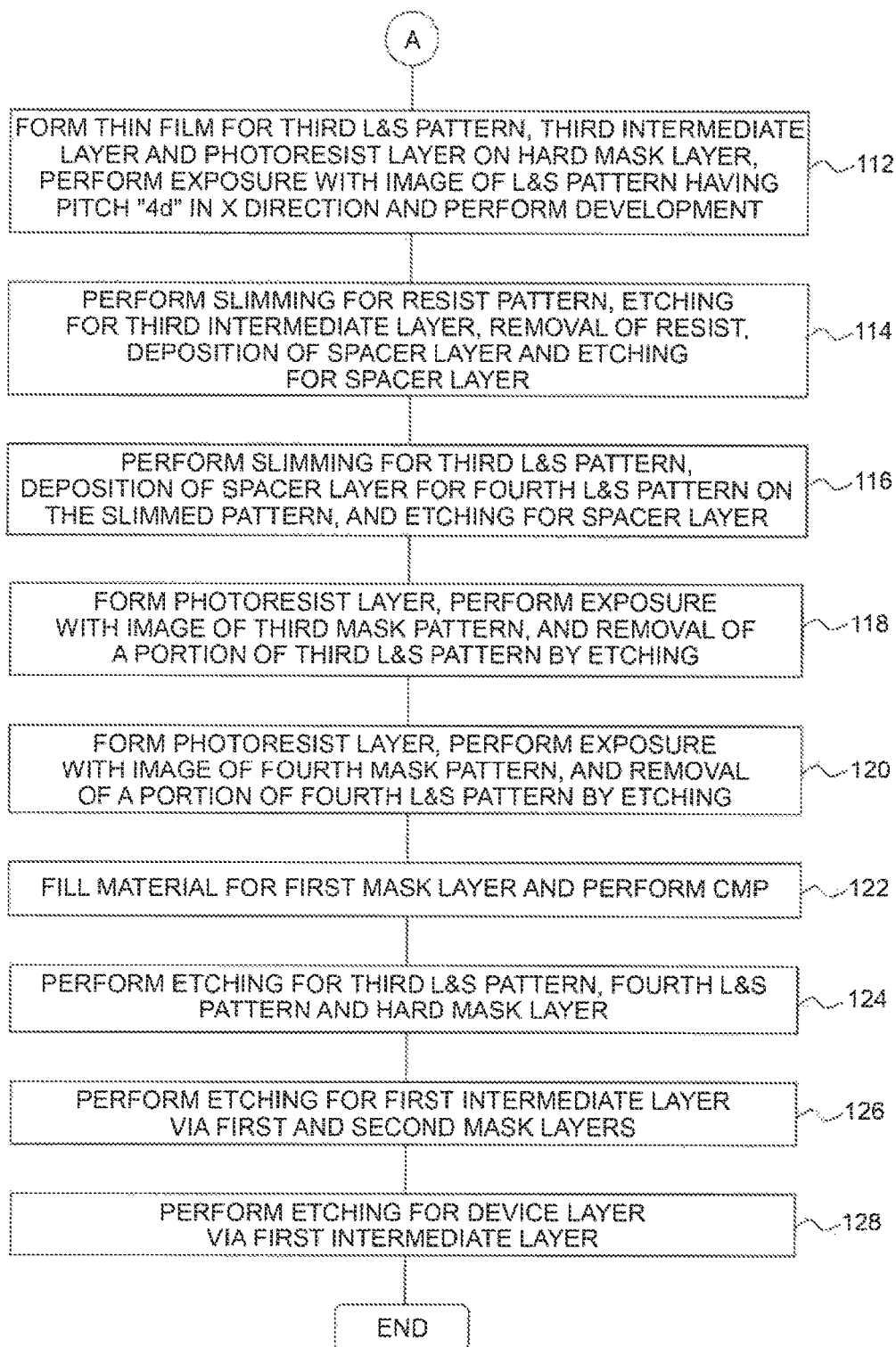

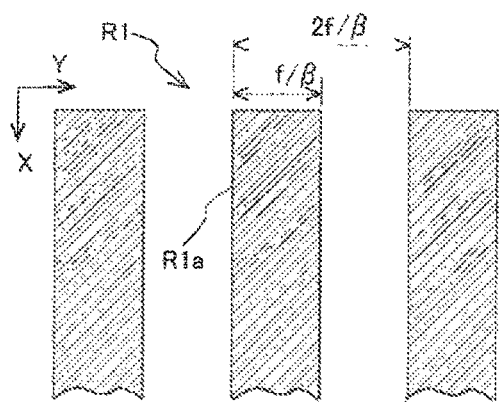
Fig. 5(A)
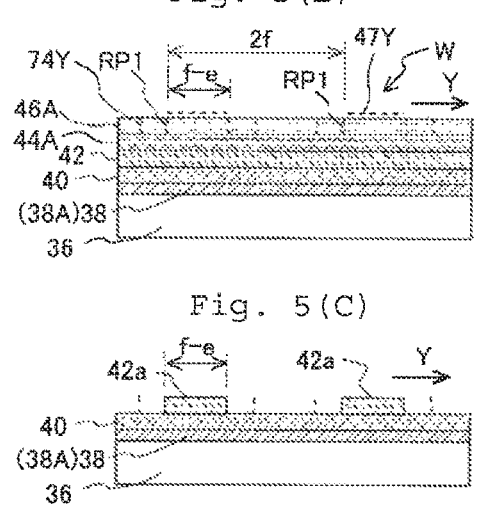
Fig. 5(B)
Fig. 5(C)
Fig. 5(D)
Fig. 5(E)
Fig. 5(F)
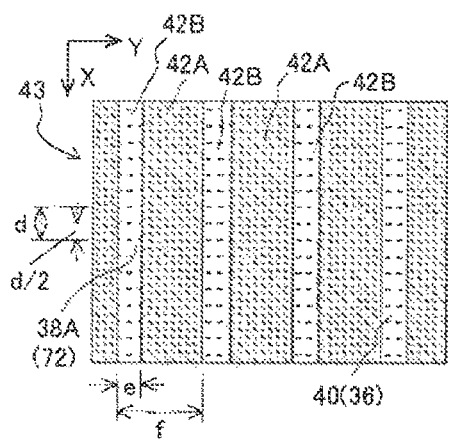
Fig. 5(G)

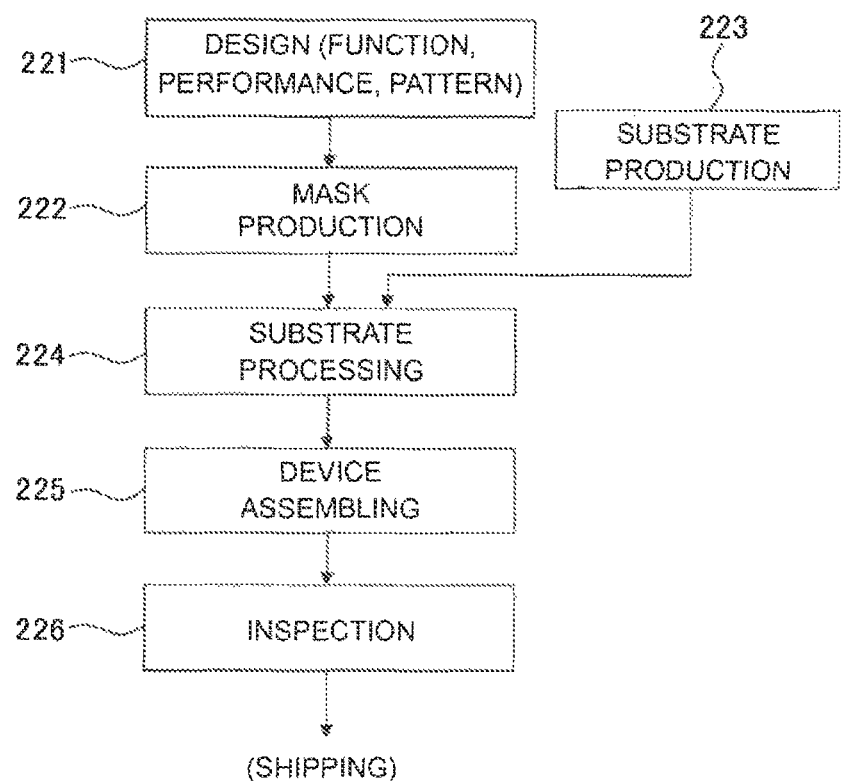

METHOD FOR FORMING PATTERN AND METHOD FOR PRODUCING DEVICE

CROSS-REFERENCE

This is a continuation of U.S. patent application Ser. No. 14/436,987 (now U.S. Pat. No. 9,946,160), which is a U.S. national phase entry of International Application No. PCT/JP2013/078243 filed Oct. 17, 2013 claiming the conventional priority of Japanese Patent Application No. 2012-231484, filed on Oct. 19, 2012. The disclosure of each of the prior applications is incorporated herein by reference in their entireties.

TECHNICAL FIELD

The present teaching relates to a pattern forming method forming a pattern on a substrate, and a method for producing a device using the pattern forming method.

BACKGROUND ART

In an exposure apparatus which uses, as an exposure light, for example an ultraviolet light in the far-ultraviolet region to vacuum ultraviolet region and which is used in a lithography process for producing electronic devices (micro devices) such as semiconductor devices, etc., shorter wavelength of the exposure light, optimized illumination condition, and the liquid immersion method for further increasing the numerical aperture of a projection optical system have been adapted, for the purpose of enhancing the resolution, In the recent years, the Pitch-Splitting Process and the Spacer Double Patterning Process (Spacer Transfer Process or Sidewall Transfer Process) have been proposed as a method for forming a periodic circuit pattern having a pitch finer (more minute) than the resolution limit of the exposure apparatus (see, for example, Andrew J. Hazelton et al., "Double-patterning requirements for optical lithography and prospects for optical extension without double patterning," J. Micro/Nanolith, HEMS MOEMS, (U.S.A.), Vol.8(1), 011003, January-March (2009)).

The Pitch-Splitting Process is generally classified to the Double Exposure process and the LELE process (Litho-Etch-Litho-Etch process) or the LPLE process (Litho-Process-Litho-Etch process). In the Double Exposure process, a non-linear resist is exposed with images of first and second mask patterns, each of which has a pitch twice the pitch of a device pattern which is to be finally produced, in a state that the phases of the images are shifted from each other, and then etching, etc., is performed (see, for example, H. Ohki et al. "Experimental study on non-linear multiple exposure method", Proc. SPIE (U.S.A.), 3051, p.85-93 (1997)). In the LELE process or the LPLE process, a process such as the etching, etc. is performed between the exposure with the image of first mask pattern and the exposure with the image of the second mask pattern.

In the Spacer Double Patterning Process (Spacer Transfer Process or Sidewall Transfer Process), for example, exposure with an image of a mask pattern having a pitch twice the pitch of a device pattern and a development of the image, etc., are performed to form a plurality of line patterns having a line width that ¼ of the pitch; a spacer is allowed to be deposited in space portions (side wall portions) located at both sides in each of the line patterns, and then, for example, each of the line patterns is removed. By doing so, a patter. having a pitch that is ½ of the pitch the image of the mask pattern can be obtained (see, for example, N. Jung et al., "Patterning with amorphous carbon spacer for expanding the resolution limit of current lithography tool", Proc. SPIE (U.S.A.), 6520, 652010 (2007)).

SUMMARY

In the conventional pattern forming method composed of the Pitch-Splitting Process or the Spacer Double Patterning Process, it is possible to form a periodic circuit pattern having a pitch more minute than the resolution limit of the exposure apparatus. However, with the conventional pattern forming method, it has been difficult to form a circuit pattern, including a non-periodic portion which is more minute than the resolution limit of the exposure apparatus, with high precision.

In view of the above-described situation, an object of an aspect of the present teaching is to make it possible to form a pattern including a non-periodic portion which is, for example, minute to such an extent of being smaller than the resolution limit of the exposure apparatus, by using the exposure apparatus or the lithography step.

According to a first aspect of the present teaching, there is provided a pattern forming method. The pattern forming method includes: forming a plurality of first line patterns of which longitudinal direction is a first direction and a plurality of second line patterns of which longitudinal direction is the first direction and of which etching characteristic is different from etching characteristic of the plurality of first line patterns, so that at least one edge portion of each of the plurality of first line patterns and at least one edge portion of each of the plurality of second line patterns are adjacent to each other; and removing at least a portion of the plurality of first line patterns by etching.

Further, a pattern forming method according to a second aspect of the present teaching includes: forming, in a second layer located above a first layer of a substrate, a plurality of first line patterns of which longitudinal direction is a first direction and a plurality of second line patterns of which longitudinal direction is the first direction and of which etching characteristic is different from etching characteristic of the plurality of first line patterns, so that at least one edge portion of each of the plurality of first line patterns and at least one edge portion of each of the plurality of second line patterns are adjacent to each other; removing a portion of the plurality of first line patterns by etching; removing a portion of the plurality of second line patterns by the etching; depositing a first mask material, for forming a first mask layer, in a position at which the portion of the plurality of first line patterns has been removed and in a position at which the portion of the plurality of second line patterns has been removed; forming the first mask layer by removing the plurality of first and second line patterns in the second layer; and processing the first layer via the first mask layer.

Furthermore, a pattern forming method according to a third aspect of the present teaching includes: forming a first pattern having a first line pattern on a substrate; forming a second pattern having a second line pattern at a position above the first pattern, the second line pattern extending in a direction crossing the first line pattern; forming a third pattern having a plurality of third line patterns at a position above the second pattern, a longitudinal direction of the plurality of third line patterns being a direction crossing the second line pattern; forming a fourth pattern having a first opening at a position above the third pattern; removing a portion of the plurality of third line patterns via the first opening; and removing a portion of the second pattern by using an edge portion of one of the plurality of third line patterns or a portion corresponding to the edge portion.

Moreover, according to a fourth aspect of the present teaching, there is provided a method for producing a device, the method including forming a circuit pattern in a substrate by using the pattern forming method of the first, second or third aspect of the present teaching.

BRIEF DESCRIPTION OF THE DRAWINGS

FIG. 5(A) is an enlarged plane view depicting a portion of a pattern of a first reticle, FIGS. 5(B), 5(C), 5(D), 5(E) and 5(F) are each an enlarged cross-sectional view depicting the wafer in each step until a second L & S pattern is formed in a second mask layer of the wafer, and FIG. 5(G) is an enlarged plane view depicting the second L & S pattern formed on the wafer.

FIG. 12 is a flow chart indicating an example of steps for producing an electronic device.

EMBODIMENTS

An example of a preferred embodiment of the present teaching will be explained with reference to FIGS. 1 to 11. At first, an explanation will be given about an example of a pattern forming system used in the embodiment for forming a circuit pattern of an electronic device (micro device) such as a semiconductor element, etc.

Figure 1A:
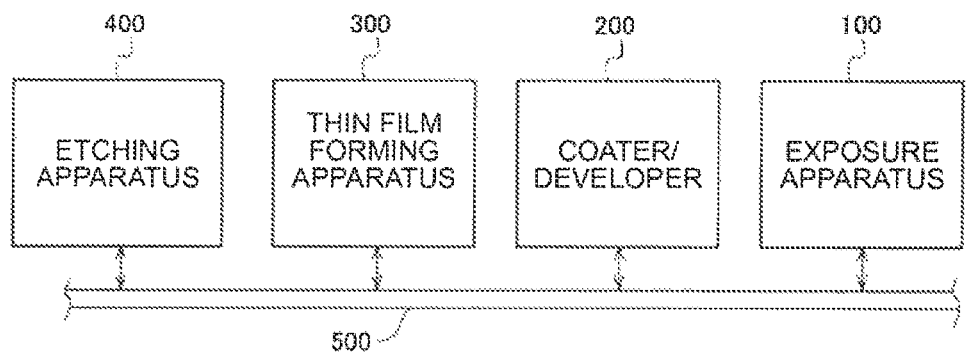
FIG. 1(A) is a block diagram depicting main parts or portions of a pattern forming system used in an embodiment of the present teaching.
Figure 1B:
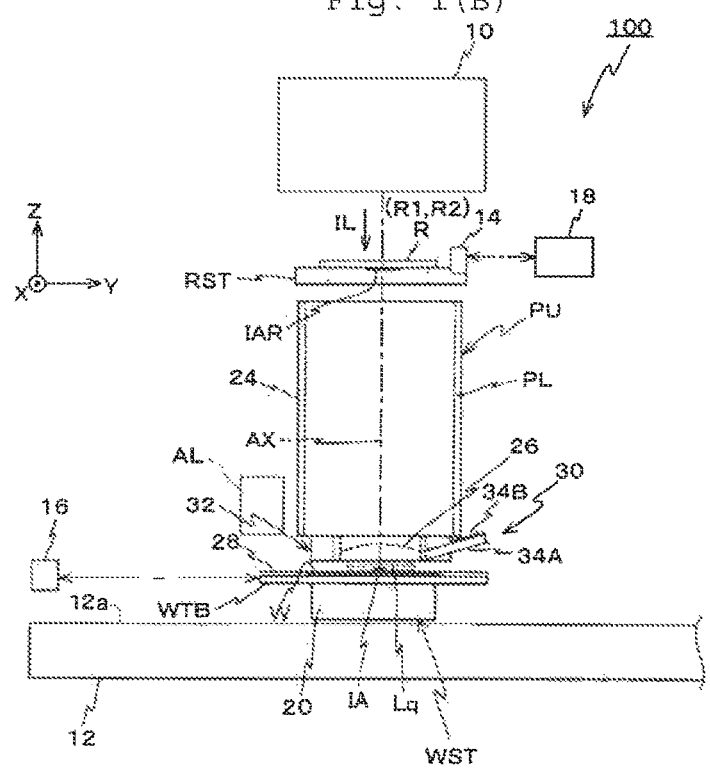
FIG. 1(B) is a diagram depicting the overall configuration of an exposure apparatus 100 depicted in FIG. 1(A).

FIG. 1(A) depicts the main parts or portions of the pattern forming system of the embodiment, and FIG. 1(B) depicts the overall configuration of an exposure apparatus 100 which is depicted in FIG. 1(A) and which is an exposure apparatus (projection exposure apparatus) of the scanning exposure type constructed of a scanning stepper (scanner). In FIG. 1(A), the pattern forming system includes the exposure apparatus 100, a coater/developer 200 which performs coating or application of a photoresist (photosensitive material) for a wafer (substrate) and which performs the development of the coated (applied) photoresist, a thin film forming apparatus 300, an etching apparatus 400 which performs the dry etching and the wet etching for the wafer, a transport system 500 which performs the transport of the wafer among the apparatuses, a host computer (not depicted in the drawings), and the like.

In FIG. 1(B), the exposure apparatus 100 is provided with an illumination system 10; a reticle stage RST which holds a reticle R (mask) illuminated with illumination light or illumination light beam for the exposure (exposure light) IL from the illumination system 10; a projection unit PU including a projection optical system PL which projects the illumination light IL allowed to exit (exiting) from the reticle R onto a surface of a wafer W (substrate); a wafer stage WST which holds the wafer W; a main controller (not depicted in the drawings) constructed of a computer controlling the entire operations of the exposure apparatus; and the like. In the following, an explanation will be given with the Z-axis being taken in parallel to an optical axis AX of the projection optical system PL, the Y-axis being taken along a direction in which the reticle R and the wafer W are scanned relative to each other in a plane perpendicular to the Z-axis (plane substantially parallel to a horizontal plane), the X-axis being taken along a direction orthogonal to the Z-axis and the Y-axis, and directions of rotation (inclination) about the X-axis, the Y-axis, and the Z-axis being designated as θx, θy, and θz directions respectively, in FIG. 1(B).

The illumination system 10 includes, as disclosed for example in the specification of United States Patent Application Publication No. US 2003/025890, etc., a light source which generates the illumination light IL and an illumination optical system which illuminates the reticle R with the illumination light IL. As an example, the ArF excimer laser beam (wavelength: 193 nm) is used as the illumination light IL. It is also possible to use, as illumination light IL, the KrF excimer laser beam (wavelength: 248 nm), the high harmonic wave such as the YAG laser or the solid-state laser (for example, the semiconductor laser), or the emission (for example, i-ray) of the mercury lamp, etc.

The illumination optical system includes: polarization controlling optical system; a light amount distribution forming optical system (a diffraction optical element or a spatial light modulator, etc.); an illuminance uniformizing optical system including an optical integrator (such as fly-eye lens or rod integrator (inner-reflection integrator)), etc.; a reticle blind (a variable field stop); and the like (all of the above are not depicted in the drawings). The illumination system 10 illuminates a slit-shaped illumination area IAR which is defined by the reticle blind on a pattern surface (lower surface) of the reticle R, and which is elongated in the X direction, with the illumination light IL in a predetermined polarization state at a substantially uniform illuminance distribution, under an illumination condition such as the dipole illumination, quadrupole illumination, annular (zonal) illumination, an illumination with a small coherence factor (a value), or a normal illumination, etc.

The reticle stage RST holds (retains) the reticle R thereon by the vacuum attraction etc. The reticle stage RST is placed on the upper surface, of an unillustrated reticle base, that is a surface parallel to the XY plane so that the reticle stage RST is movable in Y direction at a constant speed and the positions of the reticle stage RST in the X and Y directions and the rotational angle of the reticle stage RST in the θz direction are adjustable. The position information of the reticle stage RST always detected at a resolution of, for example, about 0.5 nm to about 0.1 nm via a movement mirror 14 (or a mirror-finished side surface of the stage) by a reticle interferometer 18 including a multi-axis laser interferometer. A reticle stage driving system (not depicted in the drawings) including a linear motor, etc. is controlled based on a measured value by the reticle interferometer 18, to thereby control the position and the velocity of the reticle stage RST.

Further, the projection unit PU arranged at a position below or under the reticle stage RST is provided with a barrel 24, and the projection optical system PL including a plurality of optical elements which are held in a predetermined positional relationship inside the barrel 24. The projection optical system PL is, for example, telecentric on the both sides and has a predetermined projection magnification β (for example, reduction magnification such as ¼, ⅕, etc.). An image of the circuit pattern in the illumination area IAR of the reticle R is formed, via the projection optical system PL, in an exposure area IA (area conjugated with the illumination area IAR) inside one shot area among the shot areas of the wafer W by the illumination light IL allowed to pass through the reticle R. The wafer W as the substrate in the embodiment includes, for example, a substrate constructed of a disk-shaped base member having a diameter of about 200 mm, about 300 mm or about 450 mm and composed of, for example, silicon (or may be SOI (silicon on insulator), etc.) wherein a thin film for pattern formation (oxide film, metal film, polysilicon film, etc.) is formed on a surface of the base member. Further, a photoresist (photosensitive material) is applied (coated) on a surface of the wafer W as an object to be exposed (exposure target) to provide a predetermined thickness (for example, about several tens of nm to about 200 nm).

Furthermore, for the purpose of performing the exposure to which the liquid immersion method is applied, the exposure apparatus 100 is provided with a nozzle unit 32. The nozzle unit 32 constructs a part or portion of a local liquid immersion device 30 for supplying a liquid Lq between an end-portion lens 26 and the wafer W. The nozzle unit 32 is provided such that an lower end portion f the barrel 24 is surrounded by the nozzle unit 32, the barrel 24 holding the end-portion lens 26 which is included in the plurality of optical elements constructing the projection optical system PL and which is an optical element closest to the image plane side (closest to the wafer W side). A supply port for the liquid Lq of the nozzle unit 32 is connected to a liquid supply device (not depicted) via a supply flow passage and a supply tube 34A. A recovery port for the liquid Lq of the nozzle unit 32 is connected to a liquid recovery device (not depicted) via a recovery flow passage and a recovery tube 34B. The detailed configuration of the local liquid immersion device 30 is disclosed, for example, in the specification of United States Patent Application Publication No. US 2007/242247, etc.

Moreover, the wafer stage WST is placed on an upper surface 12a, of a base plate 12, which is parallel to the XY plane such that the wafer stage WST is movable in the X and Y directions. The wafer stage WST includes a body 20 of the wafer stage (stage body 20); a wafer table WTB arranged on the upper surface of the stage body 20; and a Z-leveling mechanism which is provided inside the stage body 20 and which drives the wafer table WTB such that the position in the Z direction (Z position) and the tilt angles in the θx and θy directions of the wafer table WTB (wafer W) relative to the stage body 20 are changed or adjusted. A wafer holder (not depicted), which holds the wafer W for example by the vacuum attraction, etc. on a suction surface approximately parallel to the XY plane, is provided on the wafer table WTB. A flat-shaped plate (liquid-repellent plate) 28, having a surface which is subjected to the liquid-repellent treatment for the liquid Lq, is provided on a portion of the upper surface of the wafer table WTB, the portion surrounding the wafer holder (wafer W); the surface of the liquid-repellent plate 28 is provided to be approximately flush with the surface of the wafer W (wafer surface) placed on the wafer holder.

Further, an autofocus sensor of the oblique incident system (not depicted in the drawings) measuring the Z positions of a plurality of measuring points of the wafer surface is provided with a configuration similar to that disclosed for example in the specification of U.S. Pat. No. 5,448,332. The Z-levelling mechanism of the wafer stage WST is driven based on a measured value by the autofocus sensor so that the wafer surface is matched (focused on) the image plane of the projection optical system PL during the exposure.

Furthermore, reflection surfaces are formed by performing mirror-finish for end surfaces in the Y and X directions of the wafer table WTB, respectively. The position information (including at least the positions in the X and Y directions and the rotational angle in the θz direction) of the wafer stage WST is measured at a resolution of, for example, about 0.5 nm to about 0.1 nm by projecting interferometer beams to the reflection surfaces (may be to a movement mirror), respectively from a multi-axis laser interferometer constructing a wafer interferometer 16. A wafer stage driving system including a linear motor, etc. (not depicted in the drawings) is controlled based on a measured value of the measurement, to thereby control the position and the velocity of the wafer stage WST. Note that the position information of the wafer stage WST may be measured with a detection device of an encoder system provided with a scale of diffraction grating type and a detection head.

Moreover, the exposure apparatus 100 is provided with a wafer alignment system AL which measures the position of a predetermined alignment mark of the wafer W, and a spatial image measuring system (not depicted in the drawings) which is contained in the wafer stage WST in order to measure the position of an i rage of an alignment mark of the reticle R formed by the projection optical system PL. The alignment is performed for the reticle R and the respective shot areas of the wafer W by using the spatial image measuring system (reticle alignment system) and the wafer alignment system AL.

When performing exposure of the wafer W, a shot area of the wafer W as the exposure target is moved to be positioned beside (in front of) the exposure area IA by the movement (step movement) of the wafer stage WST in the X direction and the Y direction. Further, the liquid Lq is supplied from the local liquid immersion device 30 to a space between the projection optical system PL and the wafer W. An image of a part of the pattern of the reticle R, which is formed by the projection optical system PL, is projected onto a certain shot area among the shot areas of the wafer W, while the reticle R and the wafer W are moved synchronously in the Y direction via the reticle stage RST and the wafer stage WST. By doing so, the certain shot area is subjected to the scanning exposure with the image of the pattern of the reticle R. The step movement and the scanning exposure are repeated, and thus each of the shot areas of the wafer W is exposed with the image of the pattern of the reticle R in the step-and-scan manner and the liquid immersion manner.

Figure 2A:
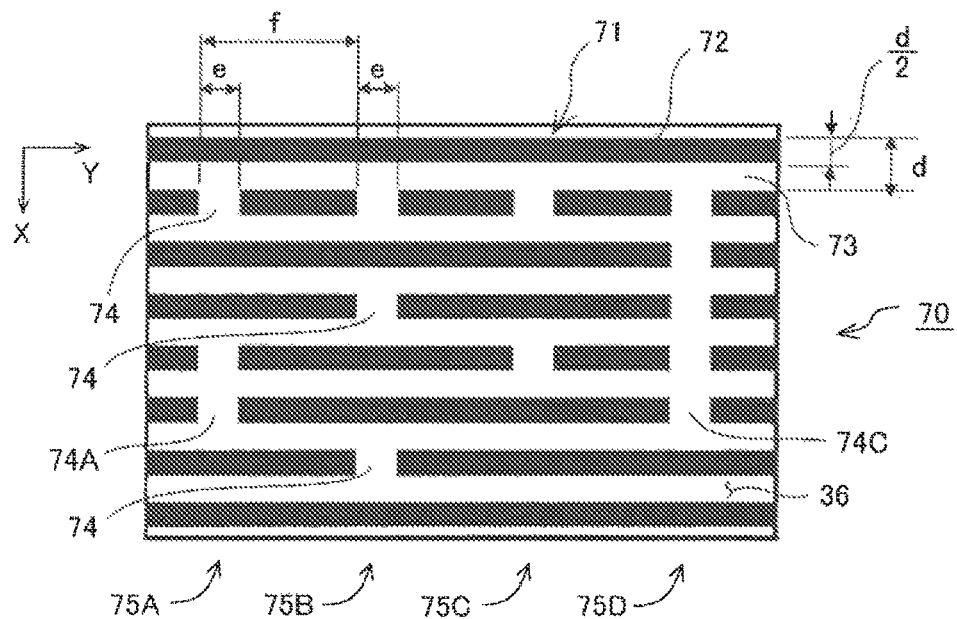
FIG. 2(A) is an enlarged view depicting a portion of a circuit pattern of a device layer as a target to be processed (processing target) in an example of the embodiment.
Figure 2B:
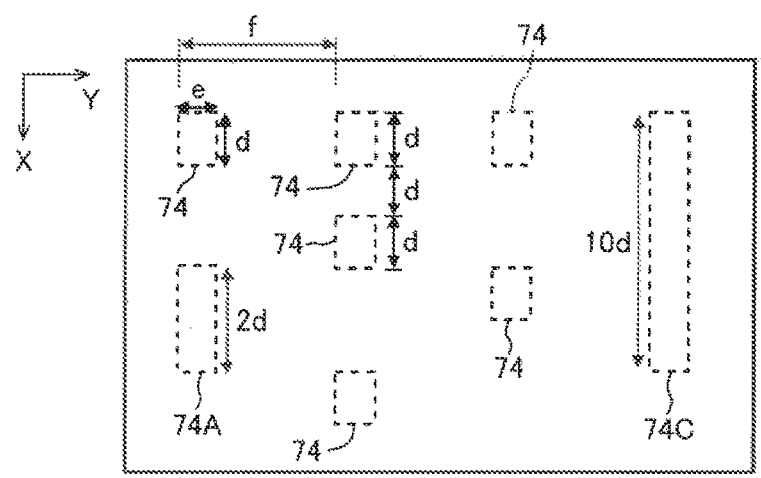
FIG. 2(B) is a view depicting the arrangement of a plurality of hole patterns in the circuit pattern of FIG. 2(A).

Next, a circuit pattern to be produced in the embodiment is, as an example, a circuit pattern 70 for a gate cell of SRAM (Static RAM) as a semiconductor element, as depicted FIG. 2(A) that is a partial enlarged view. Note that in the following explanation, a line-and-space pattern referred to also as "L & S pattern". The circuit pattern 70 is formed as follows. That is, the circuit pattern 70 is formed based on a first L & S pattern 71, on a surface of a base member 36 of the wafer, having a configuration in which line patterns 72 which have a line width d/2 and space portions 73 which have a width d/2 are arranged in the X direction that is the periodic direction at a pitch (period) d, and by removing, from each of plurality of pieces of the line pattern 72 arranged as above, a portion having a width e in a Y direction (longitudinal direction of the line pattern 72) orthogonal to the X direction such that a plurality of rows 75A, 75B, 75C and 75D of hole patterns 74, 74A and 74C (non-periodic portion) are formed. FIG. 2(B) depicts the arrangement of the plurality of hole patterns 74, 74A and 74C in FIG. 2(A). As an example, the hole pattern 74 is a pattern which is formed in one of the line patterns 72, which has the width d in the X direction, and which is the smallest among the hole patterns 74, 74A and 74C; the hole pattern 74A is a pattern which is formed on a plurality of adjacent line patterns 72 (here, two adjacent line patterns 72), and which has the width 2d in the X direction; and the hole pattern 74C is a pattern which is formed on five adjacent line patterns 72, and which is elongated in the X direction.

The period in the Y direction of two hole patterns 74 arranged on a same line pattern 72 is f (the spacing distance between the two hole patterns 74 is (f-e)), and a spacing in the X direction of two hole patterns 74 (or 74, 74A, etc.) arranged in the X direction is (m+1)d (m=0, 1, 2 . . . ). Accordingly, the arrangement of a plurality of hole patterns 74, 74A, 74C includes an irregular portion having a shape of hound tooth check or a shape of checker-board. Further, as an example, the period f is approximately in a range of twice to several times the width e, and the minimum spacing distance in the X direction and the minimum spacing distance in the Y directions between two adjacent hole patterns 74, 74A, 74C are d and (f-e), respectively. Note that the shape and arrangement of the hole patterns 74, 74A, 74C are arbitrary. The directions of the X-axis and Y-axis in FIG. 2(A) are parallel to the directions of the X-axis and Y-axis in the exposure apparatus 100 in a case that a wafer W, in which the circuit pattern 70A of FIG. 2(A) is to be formed, is placed on the wafer stage WST of the exposure apparatus 100 of FIG. 1(B).

In the embodiment, as an example, the width e of the hole pattern longer than the line width (d/2) in the X direction of line pattern 72 (the width e is, for example, approximately in a range of d/2 to d). Specifically, provided that for example the line width (d/2) is approximately in a range of 10 nm to 13 nm, the width e is, for example, approximately in a range of 15 nm to 20 nm. Further, it is also provided that the line width (d/2) and the width e are more minute than the resolution limit (that is, a half pitch if a pattern is periodic) of the exposure apparatus 100 of the liquid immersion type. Accordingly, the line width (d/2) of the L & S pattern 71 is more minute than the resolution limit of the exposure apparatus 100, and the circuit pattern 70 is also a pattern including a plurality of hole patterns 74, 74A and 74C (non-periodic portion) having the width e and arranged non-periodically (half-periodically) at a spacing distance more minute than the resolution limit of the exposure apparatus 100.

In this case, the position in the X direction of the L & S pattern 71 (line pattern 72) and the position in the Y direction of each of the hole patterns 74, etc. are set (measured), for example, based on an alignment mark (not depicted in the drawings) which is used when forming the L & S pattern 71. As an example, provided that the line width (d/2) is approximately ¼ of the resolution limit of the exposure apparatus 100, then the resolution limit of the exposure apparatus 100 is approximately 2d. In a case that the resolution limit of the exposure apparatus 100 is, for example, approximately in a range of 40 nm to 60 nm, the line width (d/2) is approximately in a range of 10 nm to 15 nm corresponding to the above-described resolution limit.

In the following, an explanation will be given about an example of a pattern forming method for forming the circuit pattern 70 by using the pattern forming system of the embodiment, with reference to the flowchart of FIG. 3. In the embodiment, the Quadruple Patterning Process which repeats the Spacer Double Patterning Process (also referred to as the Spacer Transfer Process or Sidewall Transfer Process) substantially twice is used so as to form a pattern more minute than the resolution limit of the exposure apparatus 100.

Figure 3:
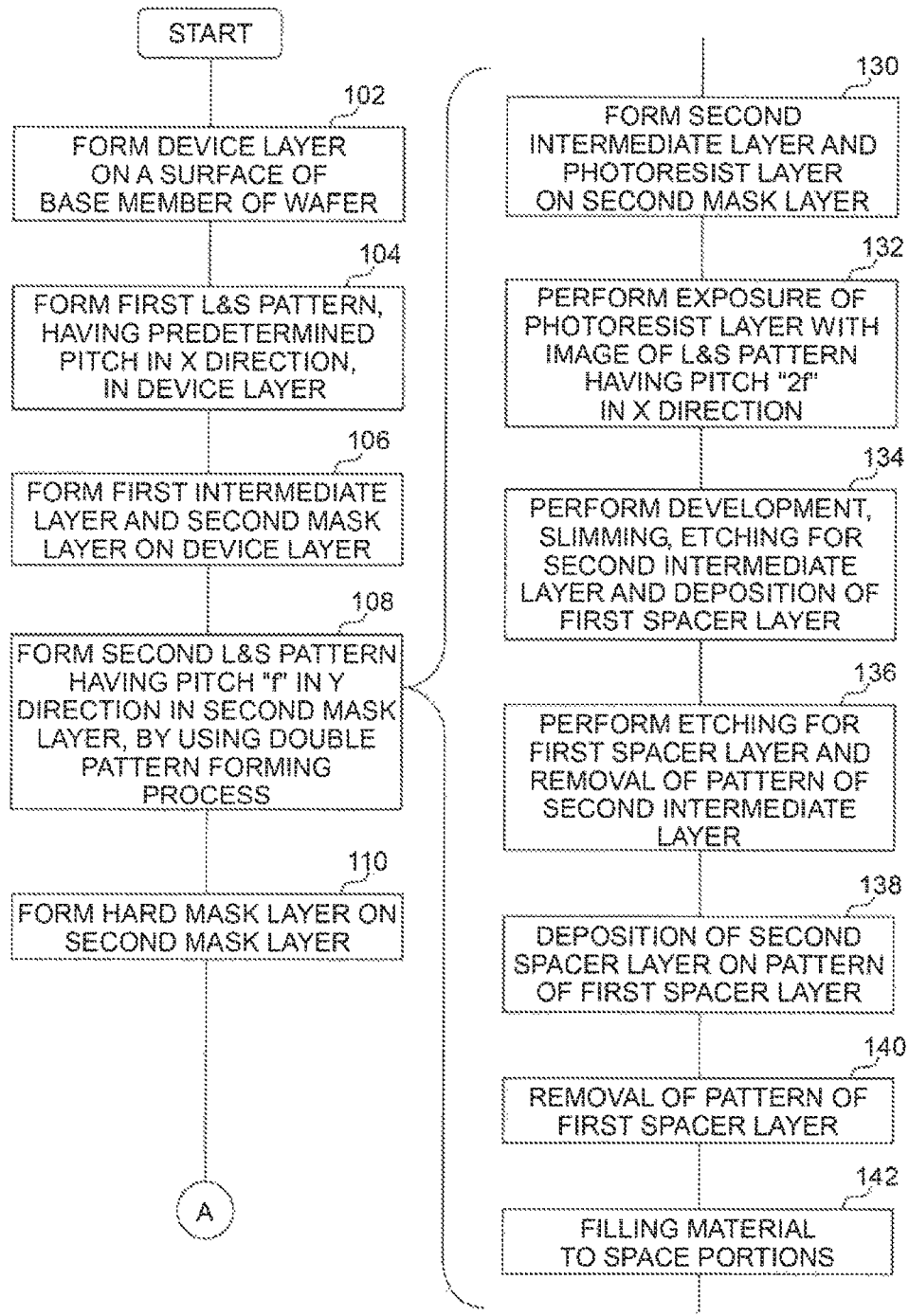
FIG. 3 is a flow chart indicating a pattern forming method of the example of the embodiment.
Figure 4A:
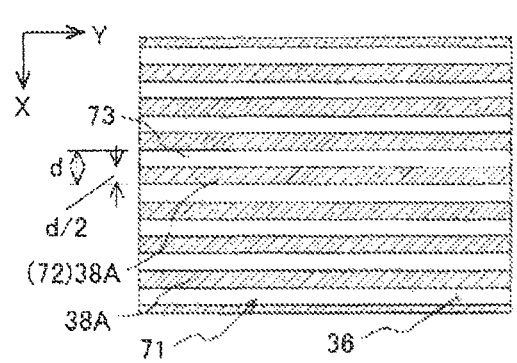
FIG. 4(A) is an enlarged plane view depicting a portion of a first L & S pattern which is firstly formed in a device layer of a wafer.
Figure 4B:
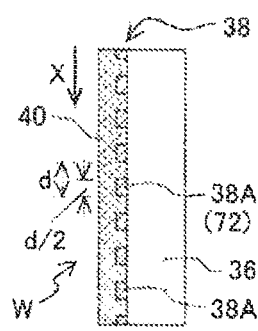
FIG. 4(B) is a side view seeing FIG. 4(A) from a +Y direction.

At first, in Step 102 of FIG. 3, the thin film forming apparatus 300 is used to form a device layer 38 as depicted in FIG. 4B. The device layer 38 is composed, for example, of a thin film of hafnium dioxide ($HfO_2$) and titanium nitride (TiN) on a flat surface of a base member 36 of the wafer W, the base member 36 being formed, for example, of silicon. Note that an oxide film or nitride film, etc. may be formed on the bottom surface of the device layer 38 (surface of the base member 36). Next, in Step 104, as an example, the Quadruple Patterning Process described above is used to form, in the device layer 38, a first L & S pattern 71 in which a plurality of line patterns 38A extending in the Y direction and having a line width d/2 in the X direction are arranged at a pitch (period) d in the X direction, as depicted in FIG. 4(A). Although the line patterns 38A correspond to the line patterns 72 in FIG. 2, the hole patterns 74 are not formed at this stage. Note that the Quadruple Patterning Process (to be described in detail later on) is a process repeating the Spacer Double Patterning Process (also referred to as the Double Pattern Forming Process) twice. Alternatively, instead of using the exposure apparatus 100, it is allowable to form the L & S pattern 71 by using an electron beam-exposure apparatus capable of exposing any minute circuit pattern on a surface of a substrate to be exposed (substrate as the exposure target) while moving the substrate as the exposure target relative to a great number of electron beam capable of independently switched ON and OFF, deflectable by a minute amount, and capable of drawing a minute dot pattern. In such a case, the line width (d/2) of the line patterns 38A of the L & S pattern 71 can be more minute than ¼ of the resolution limit (half pitch) of the exposure apparatus 100.

Next, in Step 106, a first intermediate layer 40 (a protective film for the device layer 38) which is formed, for example, of tetra ethyl ortho silicate (TEOS) is formed so as to cover the device layer 38 (see FIG. 4(B)). Note that it is also possible to use silicon oxide ($SiO_2$), instead of using a TEOS film. Further, as depicted in FIG. 5(B), a second mask layer 42 formed, for example, of a material containing carbon (an material) is formed on the first intermediate layer 40. As the organic material, for example, an ACL (Amorphous Carbon Layer) can be used.

Next, in step 108, the Double Pattern Forming Process is used to form a second L & S pattern 43 in which a plurality of line patterns 42A extending in the X direction and having a line width (f-e) in the Y direction are arranged at a pitch f in the Y direction, as depicted in FIG. 5(G) that is an enlarged plane view. As will be described later on, the edge portions (width e) in ±Y directions of the hole patterns 74A, etc., depicted in FIG. 2(A), which are to be formed at the end of the process are defined by space portions 423 of the second L & S pattern 43. Thus, the width in the Y direction of the space portions 42B is e (same as the width of the hole patterns 74, etc.). Further, the circuit pattern formed in each of the shot areas of the wafer W is a pattern formed by periodically repeating portions each having a same size as that of the pattern as depicted in FIG. 2(A) or FIG. 5(G), in the X and Y directions. Further, enlarged cross-sectional views along the Y-axis such as in FIGS. 5(B) to 5(F), etc. (to be described later on) each corresponds to the front view of the portion depicted in FIG. 2(A) or FIG. 5(G); and enlarged cross-sectional views along the X-axis such as in FIGS. 6(B) to 6(D), etc. (to be described later on) each corresponds to a side view, seen from the +Y direction, of the portion depicted in FIG. 2(A) or FIG. 5(G).

The operation (the Double Pattern Forming Process) in Step 108 of the embodiment is broken down to Steps 130 to 142. In Step 130, the thin film forming apparatus 300 is used to form a second intermediate layer 44A on a surface of the second mask layer 42 of the wafer W, as depicted in FIG. 5(B), and the coater/developer 200, a surface of the second intermediate layer 44A is coated with a photoresist layer 46A which is for example of positive type. Note that BARC (Bottom Anti-Reflection Coating) as an antireflection film may be used as the second intermediate layer 44. Then, in Step 132, the wafer W is placed on the wafer stage WST of the exposure apparatus 100 of the liquid immersion type of FIG. 1(B). A pattern of a reticle (referred to as "reticle R1") of the exposure apparatus 100 is such an L & S pattern that line patterns R1a, each of which is composed of a light shielding film having a line width of f/β (β is the projection magnification), are arranged at a pitch of 2f/β in the Y direction, as depicted in FIG. 5(A) that is an enlarged view. Then, each of the shot areas of the wafer W is exposed with an image 47Y of the pattern of the reticle R1 (image of the L & S pattern having the pitch 2f in the Y direction) by the exposure apparatus 100. Since the line width (half pitch) of the image 47Y is f (approximately in a range of being equal to the resolution limit to twice the resolution limit), the image 47Y can be projected by the exposure apparatus 100 with high precision. In this procedure, an alignment mark (not depicted) in the device layer 38 of the wafer W and an alignment mark (not depicted) in the reticle R1 are used so as to position the image 47Y in the X and Y directions.

Next, in Step 134, the photoresist layer 46A of the wafer W is developed the coater/developer 200, and the slimming is performed for each of the resist patterns RP1 (see FIG. 5(B)) formed by the development so as to form resist patterns RP2 having a line width (f-e). Note that instead of performing the slimming, it is also allowable to set a width, in Y direction, of a portion (non-exposed portion) to be (f-e), the non-exposed portion being in the image 47Y of one pitch and exposure amount of the non-exposed portion during the exposure being not more than the photosensitive level. Afterwards, the etching is performed for the second intermediate layer 44A and the second mask layer 42 of the wafer W by the etching apparatus, and then stripping of the resist, etc. are performed. By doing so, an L & S pattern is formed, in which the line patterns 42a of the second mask layer, each having a line width (f-e) are arranged at a pitch 2f in the Y direction (see FIG. 5(C)). A first spacer layer 48A is deposited (stacked) on the L & S pattern (see FIG. 5(D)).

Next, in Step 136, after performing, in the etching apparatus 400, the anisotropic etching for the spacer layer 48A of the wafer W in the direction perpendicular to the surface of the spacer layer 48A, the line patterns 42a of the second mask layer is removed. With this, as depicted in FIG. 5(E), an L & S pattern is formed on the surface of the first intermediate layer 40; in this L & S pattern, a plurality of spacer portions (side wall portions) 48ASa having the line width e are arranged at the pitch f in the Y direction. In such a manner, the L & S pattern, of which initial pitch 2f is halved, is formed. The operations in Steps 134 and 135 are also the Pitch-Splitting Process of the Double Pattern Forming Process. In the above-described Step 104, a spacer layer is further deposited on the structure depicted in FIG. 5(E), and the Double Pattern Forming Process is repeated. By doing so, a pattern having a pitch that is ¼ of the pitch of the initial pattern is consequently formed by the Quadruple Patterning Process.

Then, in Step 138, after depositing a material for forming another second mask layer so as to cover the L & S pattern of FIG. 5(E), CMP (Chemical Mechanical Polishing) is performed so as to allow the spacer portions 48ASa to appear, and in Step 140, the spacer portions 48ASa are removed by the etching. With this, as depicted in FIG. 5(F), a second L & S pattern 43 is formed on the surface of the first intermediate layer 40; in the second L & S pattern 43, line patterns 42A, in the second mask layer, having the line width (f-e) are arranged at the pitch f in the Y direction, while sandwiching the space portions 42B having the width e between the line patterns 42A. Afterwards, in Step 142, for example, silicon (Si) or polysilicon (material same as that forming a hard mask layer 50) is filled to the space portions 42B of the second L & S pattern 43. Note that in a case of executing Step 104 by using the exposure apparatus 100, the operations similar to those of Steps 130 to 136 are executed twice by using a reticle formed with an L & S pattern having line width $4d/\beta$ and a pitch $8d/\beta$ in the X direction.

Figure 6A:
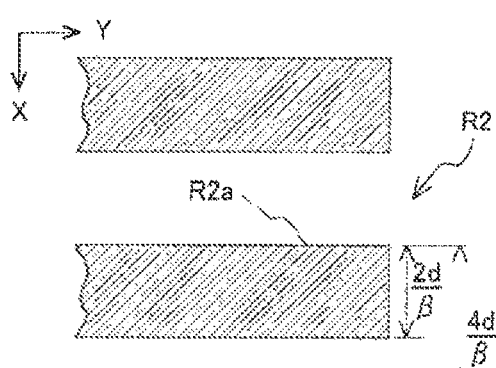
FIG. 6(A) is an enlarged plane view depicting a portion of a pattern of a second reticle.
Figure 6B:
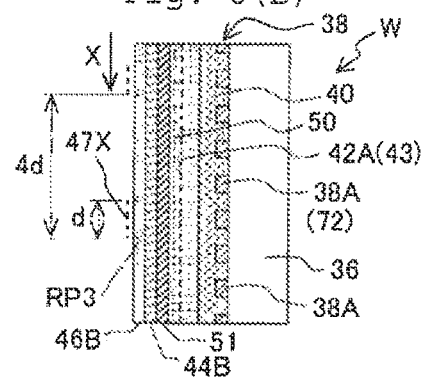
FIG. 6(B) is an enlarged cross-sectional view depicting a state that layers constituted of a hard mask layer up to a photoresist layer are formed on the second mask layer of the wafer.
Figure 6C:
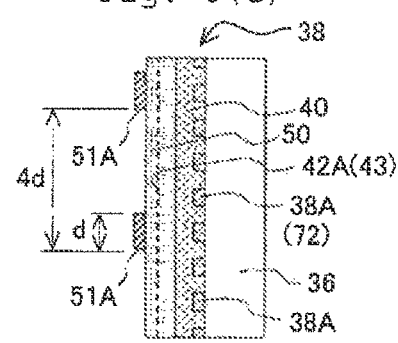
FIG. 6(C) is an enlarged cross-sectional view depicting a state that pattern is formed on the hard mask layer.
Figure 6D:
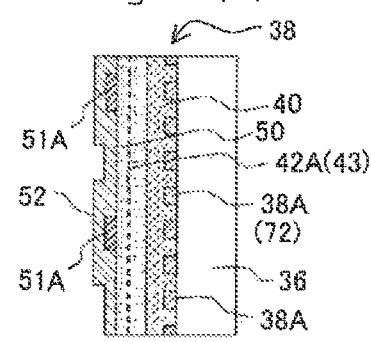
FIG. 6(D) is an enlarged cross-sectional view depicting a state that a spacer layer is formed in the uppermost layer of the wafer.

In Step 110 following Step 108, a hard mask layer 50 formed, for example, of silicon (Si) or polysilicon is formed so as to cover the second L & S pattern 43 (second mask layer 42) formed in Step 108 (see FIG. 6(B)). Then, in Step 112, an intermediate layer 51 formed of an organic material, a third intermediate layer 44B (which may be, for example, BARC) and a photoresist layer 46B are formed on the hard mask layer 50. Then, the wafer W is placed on the wafer stage WST of the exposure apparatus 100. A second reticle R2 is loaded on the reticle stage RST of the exposure apparatus 100, instead of the reticle R1. As depicted in an enlarged view in FIG. 6(A), the pattern of the reticle R2 is such an L & S pattern wherein line patterns R2a, each of which is composed of a light shielding film having a line width of $2d/\beta$ ($\beta$ is the projection magnification), are arranged at a pitch of $4d/\beta$ in the X direction. Then, after performing alignment for the reticle R2 by using an alignment mark (not depicted) in the reticle R2, each of the shot areas of the wafer W is exposed with an image 47X of the pattern of the reticle R2 (image of the L & S pattern having the pitch $4d$ in the X direction) by the exposure apparatus 100. Since the line width (half pitch) of the image 47X is approximately the resolution limit, the image 47X can be imaged by the exposure apparatus 100 with high precision. The wafer W for which the exposure has been performed is developed.

Then, in Step 114, the third intermediate layer 44B and the intermediate layer 51 are subjected to the etching with a resist pattern RP3 having a line width d, as the mask. The resist pattern RP3 is obtained by performing the slimming for the resist pattern RP3, on the wafer W, having the line width $4d$. Note that instead of performing the slimming, it is allowable to control the exposure amount in accordance with the photosensitive level of the resist to thereby adjust the line width of the resist pattern to be the line width d. Further by stripping the resist pattern and the third intermediate layer 44, an L & S pattern is formed. In the L & S pattern, line patterns 51A, in the intermediate layer 51, having the line width d in the X direction are arranged at the pitch $4d$ in the X direction (see FIG. 6(C)). A thin film 52 for a third L & S pattern, that is formed of silicon nitride (SiN) is deposited on this L & S pattern as a third spacer layer, and the etching is performed for the thin film 52 such that the remaining portions of the thin film 52 after the etching have a thickness same as that of the line patterns 51A (see FIG. 7(A)). Then, by removing the line patterns 51A, an L & S pattern is formed, in which line patterns 52A (here, line patterns extending in the Y direction) of the thin film 52, that has the line width d, in the X direction, are arranged at the pitch $2d$ in the X direction (see FIG. 7(B)).

Figure 7A:
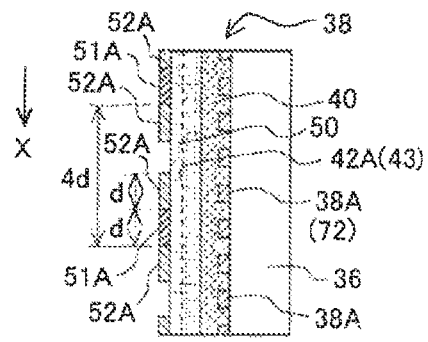
FIG. 7(A) is an enlarged cross-sectional view depicting a state that a. portion (side wall portion) of the spacer layer is allowed to remain.
Figure 7B:
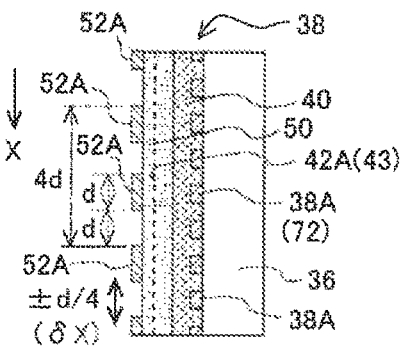
FIG. 7(B) is an enlarged cross-sectional view depicting a state that a third L & S pattern is formed on the wafer.
Figure 7C:
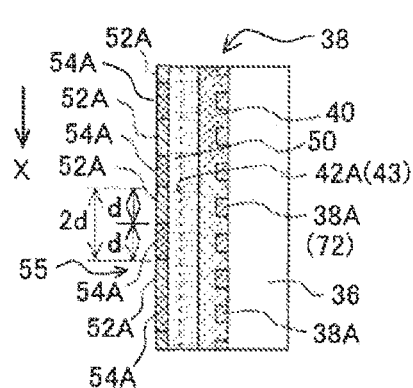
FIG. 7(C) is an enlarged cross-sectional view depicting a state that a fourth L & S pattern is formed.

Next, in Step 116, a thin film 54 formed of silicon oxide ($SiO_2$) as a spacer layer for a fourth L & S pattern is deposited so as to cover the line patterns 52A, and CMP is performed such that the height of the surface of the thin film 54 is same as the height of the surface of the line patterns 52A. As a result, the thin film 54 is remained as line patterns 54A deposited so as to fill space portions in the X direction between the line patterns 52A, as depicted in FIG. 7(C). In the following description, a pattern in which the plurality of line patterns 52A are arranged in the X direction at the pitch $2d$ is referred to as a "third L & S pattern 53", and a pattern in which the plurality of line patterns 54A are arranged in the X direction at the pitch $2d$ is referred to as a "fourth L & S pattern 55" (see FIG. 7(E)). As described above, the third L & S pattern 53 is formed substantially by the Double Pattern Forming Process (Double Patterning Process).

The positioning accuracy (alignment accuracy) $\delta X$ in the X direction of the third L & S pattern 53 is substantially the positioning accuracy of the image of the second reticle R2 of FIG. 6(A). Since it is sufficient that the positioning accuracy $\delta X$ (see FIG. 7(B)) is approximately not more than $\pm d/4$ with respect to the first L & S pattern 71 of FIG. 2(A), the positioning can be performed easily. Further, in the embodiment, the line patterns 52A of the third L & S pattern 53 are formed of silicon nitride, and the line patterns 54A of the fourth L & S pattern 55 are formed of silicon dioxide; the line patterns 52A and line patterns 54A are different from each other in the etching characteristic.

Figure 7D:
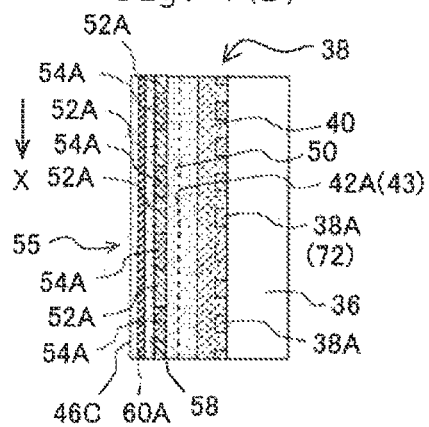
FIG. 7(D) is an enlarged cross-sectional view depicting the wafer formed with a photoresist layer, a BARC film, and an organic film.
Figure 7E:
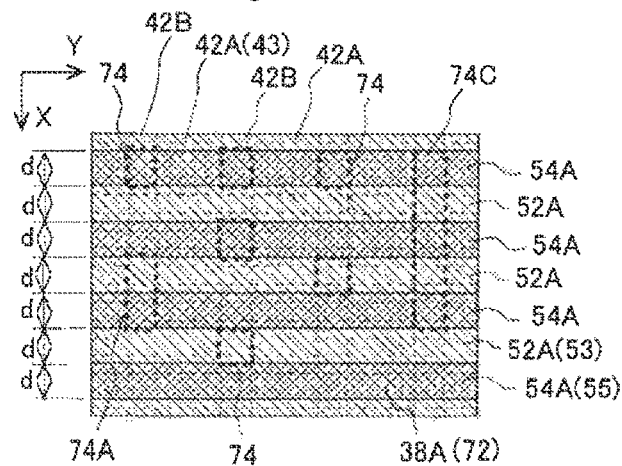
FIG. 7(E) is an enlarged plane view depicting the third and fourth L & S patterns.
Figure 8A:
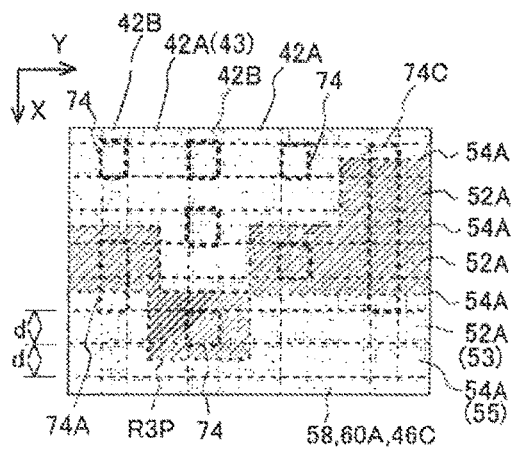
FIG. 8(A) an enlarged plane view depicting a portion of the wafer exposed with an image of a pattern of a third reticle.

Next, in Step 118, an organic film 58 formed, for example, of a material containing carbon such as ACL (Amorphous Carbon Layer), a BARC (Bottom Anti-Reflection Coating) film 60A and a photoresist layer 46C which is for example of a positive type are formed so as to cover the third and fourth L & S patterns 53 and 55 of the wafer W, as depicted in FIG. 7(D). Further, the wafer W is transported to the exposure apparatus 100, and the wafer W is exposed with an image R3P of a pattern, of a third reticle, wherein a hatched portion as depicted in FIG. 8(A) is a light-shielding portion. It is sufficient that the image R3P has such a shape that covers a portion of the third L & S pattern 53 which is to be remained (portions of the line patterns which are to be remained). Accordingly, it is sufficient that the resolution of the image R3P approximately $2d$ (half pitch) in the X direction and approximately $3e$ (half pitch) in the Y direction, and thus the image R3P can be exposed by the exposure apparatus 100 with high precision. Further, it is sufficient that the alignment errors in the X and Y directions for the image R3P are not more than $\pm d/2$ in the X direction and not more than $\pm e/2$ in the Y direction. Thus, the alignment during the exposure can be performed easily. Note that, in FIG. 7(E), FIGS. 8(A) to 8(D), etc., the positions of the hole patterns 74, 74A and 74C of FIG. 2(B) are indicated by dotted lines.

Figure 8B:
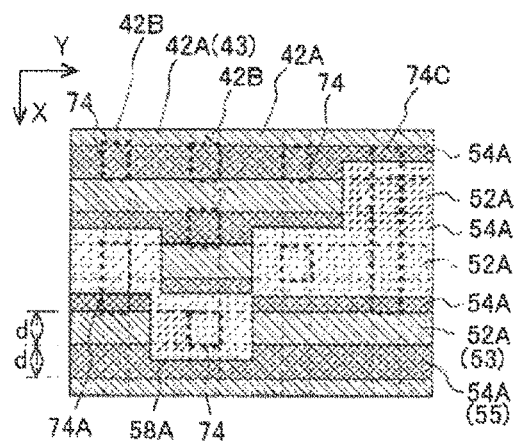
FIG. 8(B) is an enlarged plane view depicting a state that a portion of the organic film has been removed.

Then, the wafer to which the exposure is performed is developed in the coater/developer 200, the BARC film 60A is subjected to the etching using the remained resist pattern as the mask, the organic film 58 is subjected to the etching and the BARC film 60A, etc., are removed. By doing so, a protective pattern 58A, which is the pattern of the organic film 58, is allowed to remain at a portion corresponding to the image R3P, as depicted in FIG. 8(B). In this procedure, the line patterns 52A of the third L & S pattern 53 and the line patterns 54A of the fourth L & S pattern 55 are revealed at portions which are different from the protective pattern 58A.

Figure 8C:
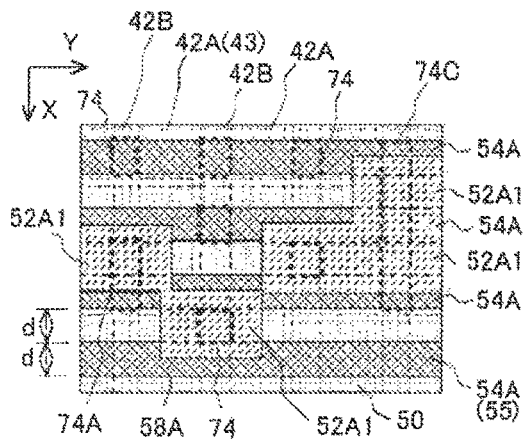
FIG. 8(C) is an enlarged cross-sectional view depicting a state that a portion of the third L & S pattern has been removed.

Further, an etching liquid (or a plasma etching phase) by which only the third L & S pattern 53 (line patterns 52A formed of SiN) is etched but the fourth L & S pattern 55 (line patterns 54A formed of $SiO_2$), the organic film 58 and the hard mask layer 50 are not etched is used to perform the etching only for the third L & S pattern 53 (line patterns 52A), using the protective pattern 58A as the mask. For example, in case of using the plasma etching, it is possible to use, as an etching gas etching only the line patterns 52A formed of SiN, a gas obtained by diluting hexafluoride ($CF_S$) gas with helium (He) gas. With this, as depicted in FIG. 8(C), a portion of the third L & S pattern 53 is removed, and a partial pattern 52A1 included in the line patterns 52A and located below the bottom portion of the protective pattern 58A is allowed to remain. Afterwards, by removing the protective pattern 58A by the etching, the partial pattern 52A1 is revealed as depicted in FIG. 8(D).

Figure 8D:
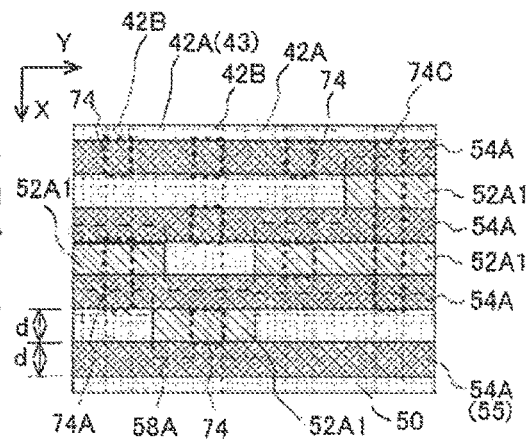
FIG. 8(D) is an enlarged plane view depicting a state that a remaining portion of the organic film has been removed.
Figure 9A:
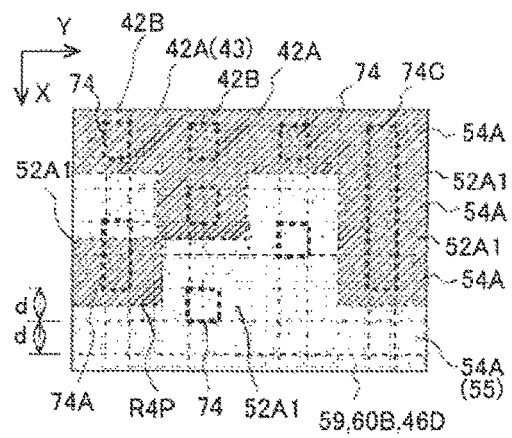
FIG. 9(A) is an enlarged plane view depicting a state that the wafer, on which a photoresist layer, a BARC film and an organic film are formed again, is exposed with an image of a pattern of a fourth reticle.

Next, in Step 120, an organic film 59 formed, for example, of a material including carbon such as ACL, a BARC film 60B and a photoresist layer 46D which is for example of a positive type are formed as depicted in FIG. 9(A) so as to cover the surface of the wafer W of FIG. 8(D). Further, the wafer W is transported to the exposure apparatus 100, and the wafer W is exposed with an image R4P of a pattern, of a fourth reticle, wherein a hatched portion as depicted in FIG. 9(A) is a light-shielding portion. It is sufficient that the image R4P has such a shape that covers a portion in the fourth L & S pattern 55 (line patterns 54A) which is to be remained (portions of the line patterns 54A which are to be remained). Accordingly, it is sufficient that the resolution of the image R4P is approximately 2d (half pitch) in the X direction and approximately 3e (half pitch) in the Y direction, and thus the image R4P can be exposed by the exposure apparatus 100 with high precision. Further, it is sufficient that the alignment errors in the X and Y directions for the image R4P are not more than ±d/2 in the X direction and not more than ±e/2 in the Y direction. Thus, the alignment during the exposure can be performed easily.

Figure 9B:
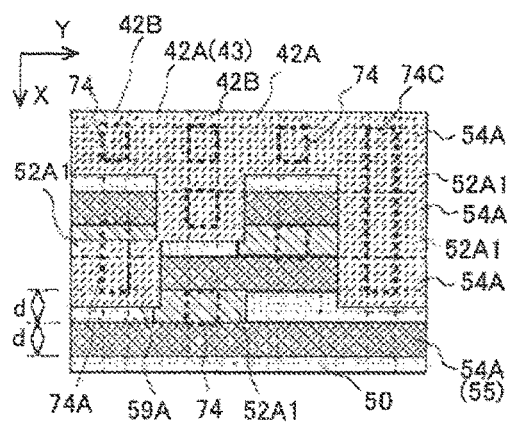
FIG. 9(B) is an enlarged plane view depicting a state that a portion of the organic film has been removed.

Then, the wafer W to which the exposure has been performed is developed in the coater/developer 200, the BARC film 60B is subjected to the etching using the remained resist pattern as the mask, the organic film 59 is subjected to the etching and the BARC film 60B, etc., are removed. By doing protective pattern 59A, which is the pattern the organic film 59, is allowed to remain at a portion corresponding to the image R4P, as depicted in FIG. 9(B). In this procedure, the partial patterns 52A1 (the portions of the line patterns 52A) and the line patterns 54A of the fourth L & S pattern 55 are revealed at portions which are different from the protective pattern 59A.

Figure 9C:
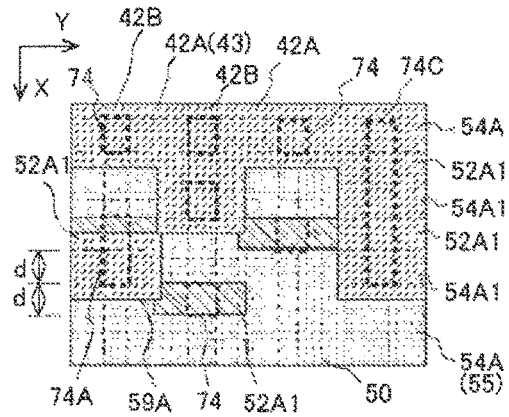
FIG. 9(C) is an enlarged plane view depicting a state that a portion of the fourth L & S pattern has been removed.
Figure 9D:
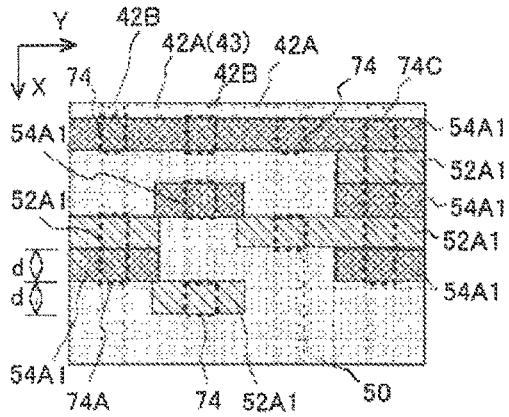
FIG. 9(D) is an enlarged plane view depicting a state that a remaining portion of the organic film has been removed.

Further, an etching liquid (or a plasma etching phase) by which only the fourth L & S pattern 55 (line patterns 54A formed of $SiO_2$) is etched but the organic film 59, the partial pattern 52A1 (line patterns 52A formed of SiN) and the hard mask layer 50 are not etched is used to perform the etching only for the fourth L & S pattern 55 (line patterns 54A), using the protective pattern 59A as the mask. For example, in case of using the plasma etching, it is possible use, as an etching gas etching only the line patterns 54A formed of $SiO_2$, a gas obtained by diluting a CF-based gas (fluorine-based gas), such as trifluoromethane ($CHF_3$) or carbon tetrafluoride ($CF_4$), with Argon (Ar) gas. With this, as depicted in FIG. 9(C), a portion of the line patterns 54A is removed. Then, the protective pattern 59A is removed. In this procedure, as depicted in FIG. 9(D), only a partial pattern 54A1 included in the line patterns 54A and located below the bottom portion of the protective pattern 59A is allowed to remain. As appreciated from FIG. 9(D), the remained partial patterns 52A1 and 54A1 define the positions of the edge portions in the X direction of the hole patterns 74, etc.

Figure 10A:
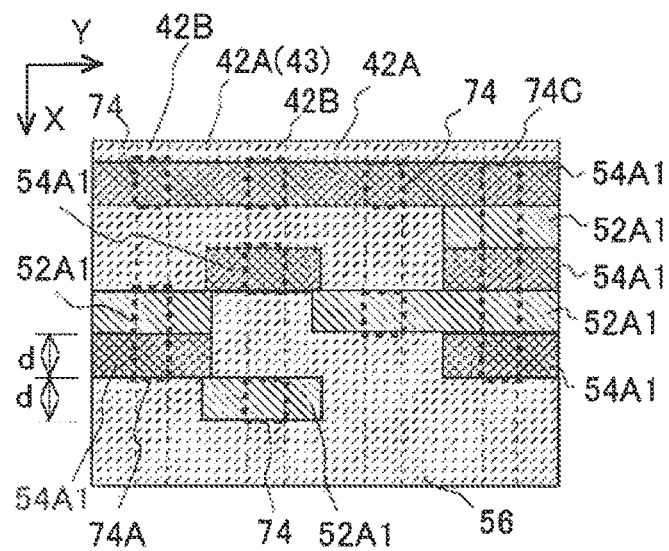
FIG. 10(A) is an enlarged plane view depicting a state that a material of first mask layer (first mask layer material) is filled between the third and fourth L & S patterns of 9(D)
Figure 10B:
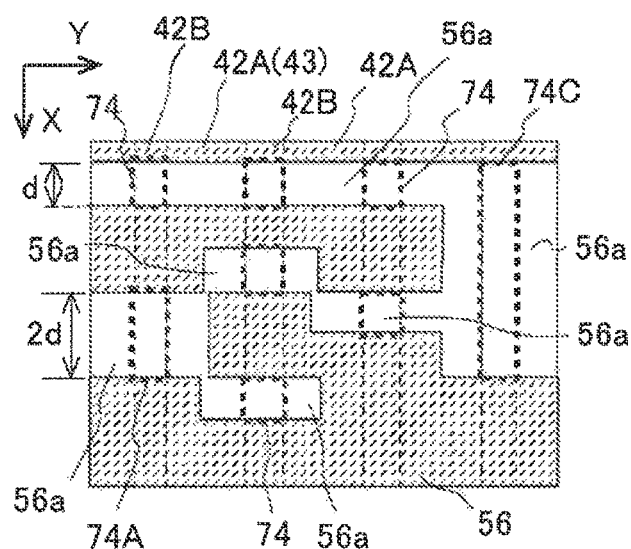
FIG. 10(B) is an enlarged plane view depicting a state that the third and fourth L & S patterns have been removed from the state depicted in FIG. 10(A).

Next, in Step 122, a material 56 for first mask layer (first mask layer-material 56) composed of an organic material same as that for forming the second mask layer 42 is filled between the partial patterns 52A1 and 54A1 on the hard mask layer 50 of the wafer W, as depicted in FIG. 10(A); and the surface of the filled first mask layer-material 56 is subjected to the flattening by CMP. Then, in Step 124, the partial pattern 52A1 (third L & S pattern 53), the partial pattern 54A1 (fourth L & S pattern 55) and the hard mask layer 50 (portions, of the hard mask layer 50 including the material of the line portions 42B of the second L & S pattern 43 which are located below the bottom portions of the partial patterns 52A1 and 54A1) are successively removed by the etching. By doing so, in the first mask layer-material 56, portions at which the partial patterns 52A1 and 54A1 have been present become openings 56a defining the edge portions in the X direction of the hole patterns 74, etc. As a result, the second L & S pattern 43 (second mask layer 42) and the material 56 (first mask layer) provided with the openings 56a are formed to be overlapped (overlaid) with each other above the device layer 38.

Figure 11A:
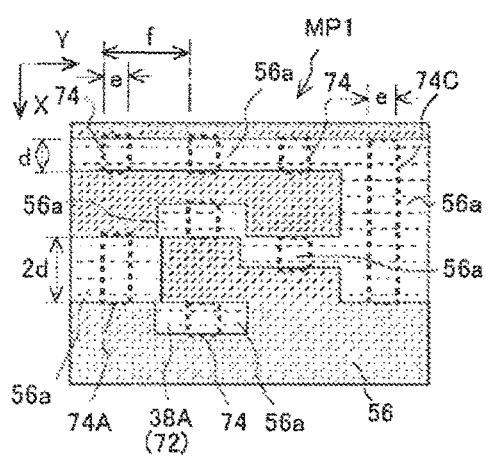
FIG. 11(A) is an enlarged plane view depicting a pattern of the first mask layer.
Figure 11B:
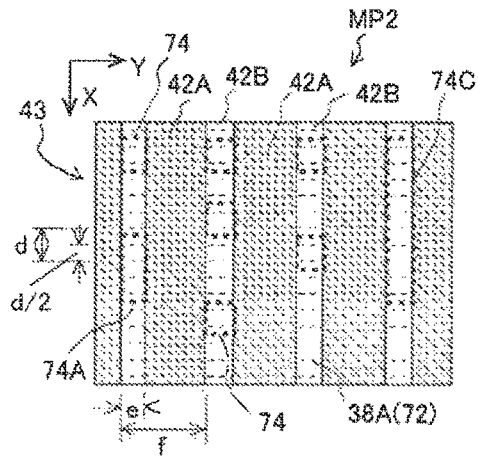
FIG. 11(B) is an enlarged plane view depicting a pattern of a second mask layer.
Figure 11C:
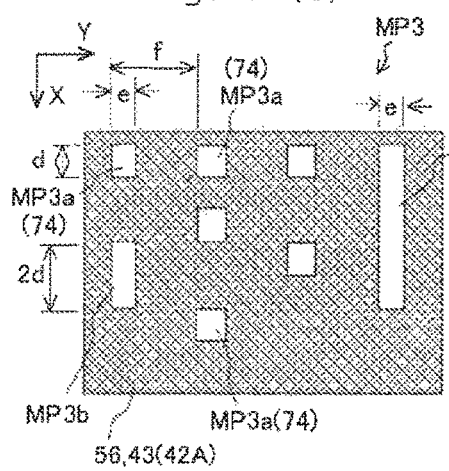
FIG. 11(C) is an enlarged plane view depicting a combined mask pattern.

In this case, the material 56 provided with the openings 56a can be considered as a first mask pattern MP1 wherein the etching can be performed at the portions of the openings 56a, as depicted in FIG. 11(A). Further, the second L & S pattern 43 can be considered as a second mask pattern MP2 wherein the etching can be performed at the ace portions 42B (openings) between the line patterns 42A, as depicted in FIG. 11(B). Note that in practice, however, the material of the hard mask layer 50 remains in the portions, among the space portions 42B of the mask pattern MP2, arranged below portions at which the material 56 of the mask pattern MP1 remains. As a result, in a case of performing the etching for the material of a layer located below the mask patterns MP1 and MP2 via the mask patterns MP1 and MP2, the mask patterns MP1 and MP2 function as a combined (composite) mask pattern MP3 wherein portions at which the openings 56a of the mask pattern MP1 and the openings (space portions 42B) of the mask pattern MP2 overlap with each other are a plurality of openings MP3a, MP3b and MP3c in each of which the width in the X direction is d, 2d, etc., and the width in the Y direction is e, as depicted in FIG. 11(C). The openings MP3a, etc. of the combined mask pattern MP3 are arranged in a same manner as the hole patterns 74, etc. of the circuit pattern 70 of FIG. 2(A).

Figure 11D:
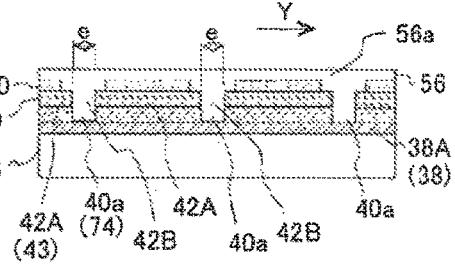
FIG. 11(D) is an enlarged cross-sectional view depicting a state of the wafer wherein a first intermediate layer has been etched, and FIG. 11(E) an enlarged cross-sectional view depicting the wafer in a state the device layer has been etched.
Figure 11E:
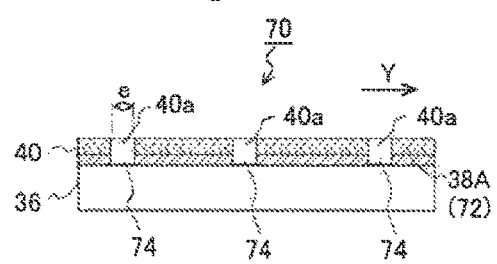

Then, in Step 126, the etching is performed for the first intermediate layer 40 via the combined mask pattern MP3 composed of the first and second mask layers, thereby forming openings 40a, etc., in the first intermediate layer 40, at locations corresponding to the hole patterns 74, etc., as depicted in FIG. 11(D). Further, in Step 128, the etching is performed for the line patterns 38A (72) of the device layer 38 via the first intermediate layer 40, thereby forming a circuit pattern 70 in which the hole patterns 74, etc., are formed in the respective line patterns 38A in a non-periodic arrangement, as depicted in FIG. 11(E).

As described above, according to the embodiment, the L & S pattern 71 is formed in Step 104 by using the Quadruple Patterning Process and the L & S pattern 43 (the pattern of the second mask layer) is formed in Step 108 by using the Double Patterning Process. Accordingly, the periodic pattern which is more minute than the resolution limit of the exposure apparatus 100 can be formed in the wafer W with high precision by using the exposure apparatus 100. Further, in Steps 112 to 116, the third L & S pattern 53 and the fourth L & S pattern 55 (the pattern of the first mask layer) are formed by substantially using the Double Pattern Forming Process. Accordingly, it is possible to form the patterns each having a line width more minute than the resolution limit of the exposure apparatus 100 with high precision in a manner that an edge portion of each of the patterns are adjacent to each other. Furthermore, the portion of the third L & S pattern 53 and the portion of the fourth L & S pattern 55 are removed successively and selectively in Steps 118 and 120, by utilizing the difference in the etching characteristic between the third and fourth L & S patterns 53 and 55. Accordingly, it is possible to form, by using the exposure apparatus 100 (lithography step), the pattern (partial patterns 52A1, 54A1) for forming the openings 56a corresponding to the hole patterns 74, etc. to be formed as the formation target, which are arranged in an irregular manner at the spacing distance more minute than the resolution limit of the exposure apparatus 100. Therefore, by performing the etching for the first intermediate layer 40 and the device layer 38 with the combined mask pattern MP3 which is formed as the result of the above steps (Steps 126, 128), the circuit pattern 70 including the non-periodic portion (hole pattern 74) which is more minute than the resolution limit of the exposure apparatus 100 can be formed with high precision.

The effects, etc. of this embodiment are as follows.

The pattern forging method, which uses the pattern forming system including the exposure apparatus 100 according to this embodiment, includes: Step 104 of forming the first L & S pattern 71 (first pattern) having the plurality of first line patterns 38A (72) arranged in the X direction on the wafer W (substrate), Step 106 of forming the first intermediate layer 40 (first layer) so as to cover the first L & S pattern 71; Steps 112 to 116 for forming, in the first mask layer (second layer) located above the first intermediate layer 40 (first layer), the plurality of line patterns 52A (first line patterns) of which longitudinal direction is the Y direction (first direction) and the plurality of line patterns 54A (second line patterns) of which longitudinal direction is the Y direction and of which etching characteristic is different from that of the line patterns 52A in a manner that at least one edge portion of each of the plurality of line patterns 52A and at least one edge portion of each of the plurality of line patterns 54A are adjacent to each other; Step 118 for removing a portion of the line patterns 52A by the etching; Step 120 for removing a portion of the line patterns 54A by the etching; Step 122 for depositing the material 56 (material for forming the first mast layer) in the first mask layer at portions each corresponding to the portion of the line pattern 52A or the portion of the line patterns 54A which has been removed; Step 124 for removing the partial patterns 52A1 and 54A1 so as to form the first mask pattern MP1; and Step 126 for processing the first intermediate layer 40 via the first mask pattern MP1.

According to the embodiment, the plurality of line patterns 52A having the minute line width can be formed based on the line pattern composed of the resist pattern RP3 (or RP4) formed with the exposure apparatus 100, and the plurality of line patterns 54A can be formed based on the plurality of line patterns 52A. Further, the difference in the etching characteristic between the line patterns 52A and 54A is utilized so as to remove the portion of the line patterns 52A and the portion of the line patterns 54A successively, thereby making it possible to form the non-periodic portion (portion corresponding to the openings 56a). Furthermore, by processing the first intermediate layer 40 via the first mask pattern MP1 in which the non-periodic portion is the openings, the hole patterns 74, 74A and 74C which are non-periodically arranged at the minute spacing distance therebetween can be formed with high precision.

Accordingly, it possible to form the circuit pattern 70, including the non-periodic portion (hole patterns 74, 74A and 74C) which is more minute than the resolution limit of the exposure apparatus 100, with high precision by using the lithography step including the exposure by the exposure apparatus 100.

Further, in Steps 102, 108 and in Steps 112 to 116, the Quadruple or Double Pattern Forming Process is substantially used, and thus the periodic pattern more minute than the resolution limit of the exposure apparatus 100 can be formed with high precision. Note that in a case that the size and spacing distance of the hole patterns 74, 74A, 74C as the object to be formed (formation target) each has a value which is, for example, not less than ½ of the resolution limit of the exposure apparatus 100, the Double Patterning Process (for example, the Spacer Double Patterning Process) can be substantially used in Steps 102, 108 and in Steps 112 to 116. Further, instead of using the Spacer Double Patterning Process, it is also possible to use the Double Patterning Process (Pitch-Splitting Process) based on the Double Exposure Process, LELE (Litho-Etch-Litho-Etch) Process or the LPLE (Litho-Process-Litho-Etch) Process, etc.

Note that in the embodiment, in order to perform selective dry etching for the SiN portion (line patterns 52A) without etching the $SiO_2$ portion (line patterns 54A), it is allowable to adopt, for example, chemical dry etching using the fluorine radical and hydrogen radical as disclosed, for example, in Japanese Patent Application Laid-open No. H08-264510.

Further, as a condition for performing the etching selectively for the SiN portion (line patterns 52A) and the $SiO_2$ portion (line patterns 54A), it is allowable to use $CHF_3$, $CF_4$, Ar and oxygen ($O_2$) as the etching gas during the dry etching for SiN (silicon nitride) and to use $CHF_3$, $CF_4$ and Ar as the etching gas during the dry etching for $SiO_2$ (silicon oxide), as disclosed, for example, in Japanese Patent Application Laid-open No. H05-160077.

Furthermore, it is allowable that the line patterns 52A are formed of a metallic film such as aluminum, the line patterns 54A are formed of SiN, the etching for the line patterns 52A is performed by using a chlorine-based gas, and the etching for the line patterns 54A is performed by using the above-described fluorine-based gas.

Moreover, in the embodiment, the L & S pattern having a pitch that is ¼ of the pitch of the original or initial L & S pattern (the image of the pattern of the reticle) is formed by using for example the Quadruple Pattern Forming Process. It is possible, however, to repeat the Spacer Double Patterning Process for k times (k is an integer not less than 3) for the original pattern so as to form an L & S pattern (the L & S pattern will become the first L & S pattern 71, the second L & S pattern 43, the third L & S pattern 53, 52A, and/or the fourth L & S pattern 55, 54A) of which pitch is $1/(2^k)$ of the pitch of the original pattern. With this, it is possible to form a circuit pattern having the periodic and non-periodic structures which are more minute than ¼ of the resolution limit of the exposure apparatus 100.

Further, in the respective embodiments, although a portion of the periodic pattern (first L & S pattern 71) is removed, the pattern forming method of the embodiment is applicable also to a case of removing a portion of the non-periodic pattern. Furthermore, the above-described pattern forming method is applicable also to a case of adding a non-periodic pattern to a periodic non-periodic pattern.

Moreover, in the respective embodiments, the first mask layer is formed by filling the first mask layer-material 56 to the portions, of the first and second line patterns (third L & S pattern 53 and fourth L & S pattern 55), at which portions of the patterns are absent (removed), respectively. It is allowable, however, to use the portions, of the first and second line patterns, at which portions of the patterns are allowed to remain, so as to perform the etching for portions of a layer located below the first and second line patterns.

Further, in the respective embodiments, although the first and second line patterns (third L & S pattern 53 and fourth L & S pattern 55) which are mutually different in the etching characteristic are used, it is allowable to use only one of the first and second line patterns.

Next, in a case that a semiconductor device (electronic device) such as a SRAM is produced by using the pattern forming method of the respective embodiments described above, the semiconductor device is produced, as depicted in FIG. 12, by performing a step 221 of designing the function and the performance of the semiconductor device; a step 222 of producing a mask (reticle) based on the designing step; a step 223 of producing a substrate (or a base member for a wafer) for the semiconductor device; a substrate-processing step 224; a step 225 of assembling the device (including processing processes such as a dicing step, a bonding step, and a packaging step); an inspection step 226; and the like. Further, the substrate-processing step 224 includes the pattern forming method of the embodiments as described above (Steps 102 to 128 of FIG. 3) and the pattern forming method includes a step of exposing the substrate with a pattern of the reticle by an exposure apparatus, a step of developing the exposed substrate, a step of heating (curing) and etching the developed substrate, etc.

In other words, the method for producing the device includes the substrate-processing step 224, and the substrate-processing step 224 includes a step of forming the hole patterns 74, 74A and 74C on the substrate (wafer W) by using the pattern forming method of the above-described embodiment. Further, as an example, the pattern formed on the substrate is a pattern obtained by removing a portion from the periodic pattern (first L & S pattern 71).

According to the method for producing the device, it is possible to produce a semiconductor device including a circuit pattern which includes a non-periodic portion finer (more minute) than the resolution limit of the exposure apparatus with high precision, by using the exposure apparatus.

Note that the device, which is the production objective in the embodiment described above, can be any arbitrary semiconductor device including DRAM, CPU, DSP, etc., other than SRAM. Further, the pattern forming method of the embodiment described above can be also applied when producing an image pickup element other than the semiconductor device, an electronic device (microdevice) such as MEMS (Microelectromechanical Systems), etc.

In the embodiments described above, a dry type exposure apparatus, which is not of the liquid immersion type, may be used as the exposure apparatus. Other than the exposure apparatus which uses the ultraviolet light as the exposure light, it is also allowable to use, for example, a EUV exposure apparatus which uses the EUV light (Extreme Ultraviolet Light) having a wavelength of about several nm to several 10 nm as the exposure light, or an electron beam-exposure apparatus which uses an electron beam as the exposure light, etc.

The present teaching is not limited to the embodiments described above, and may be embodied in other various forms within a scope without deviating from the gist or essential characteristics of the present teaching.

According to the embodiments of the present teaching, based on the line pattern formed by using, for example, the exposure apparatus, it is possible to form the plural first line patterns and the plurality of second line patterns each having the line width more minute than the line width of the line pattern. Further, a non-periodic portion can be formed by removing a portion of the first line patterns by utilizing the difference in the etching characteristic between the first and second line patterns. Furthermore, by using the non-periodic portion, it is possible to form, for example, a pattern including a non-periodic portion which is minute, for example, to such an extent of being smaller than the resolution limit of the exposure apparatus, by using the exposure apparatus or a lithography step, Further, according to the embodiments, it is possible to form the plurality of third line patterns at a position above the second line patterns, and to define, with high precision, the boundary of the portion to be removed from the second line patterns by utilizing the edge portion of one of the third line patterns.

The invention claimed is:

1. A device manufacturing method comprising:
   forming, in a first layer, a plurality of first line patterns of which longitudinal direction is a first direction; and
   forming, in a second layer above the first layer, a plurality of second line patterns of which longitudinal direction is a second direction, and a plurality of third line patterns of which longitudinal direction is the second direction and of which etching characteristic is different from etching characteristic of the plurality of second line patterns, so that at least one edge portion of each of the plurality of second line patterns and at least one edge portion of each of the plurality of third line patterns are adjacent to each other,
   wherein, as viewed from a position above the second layer, the at least one edge portion of one of the plurality of second line patterns and the at least one edge portion of one of the plurality of third line patterns which are adjacent to each other are positioned between two line patterns, of the plurality of first line patterns, adjacent to each other.

2. The device manufacturing method according to claim 1, further comprising:
   forming a first mask layer having an opening which is arranged above at least one line pattern of the plurality of second line patterns and at least one line pattern of the plurality of third line patterns;
   removing at least a portion of the plurality of second line patterns via the opening by using a first etchant; and
   removing at least a portion of the plurality of third line patterns via the opening by using a second etchant different from the first etchant.

3. The device manufacturing method according to claim 2, further comprising forming a second mask layer in a position at which the portion of the plurality of second line patterns has been removed by an etching with the first etchant and/or a position at which the portion of the plurality of third line patterns has been removed by an etching with the second etchant.

4. The device manufacturing method according to claim 3, further comprising processing at least one line pattern of the plurality of first line patterns via the second mask layer.

5. The device manufacturing method according to claim 2, wherein in a case of removing the portion of the plurality of second line patterns by an etching with the first etchant, the plurality of third line patterns are not subjected to the etching with the first etchant; and
   in a case of removing the portion of the plurality of third line patterns by an etching with the second etchant, the plurality of second line patterns are not subjected to the etching with the second etchant.

6. The device manufacturing method according to claim 5, wherein the etching for each of the plurality of second line patterns and the plurality of third line patterns is performed by a dry etching; and an etching gas for the plurality of second line patterns and an etching gas for the plurality of third line patterns are different from each other.

7. The device manufacturing method according to claim 1, wherein the first layer is formed above a substrate, and a circuit pattern formed on the substrate includes a plurality of hole patterns which are non-periodic.

8. The device manufacturing method according to claim 1, wherein the second direction is parallel to the first direction.

9. The device manufacturing method according to claim 4, wherein the first layer is provided on a substrate, and a circuit pattern formed on the substrate includes at least a portion of the line pattern of the plurality of first line patterns which has been processed.

10. The device manufacturing method according to claim 4, wherein the processing of the at least one line pattern of the plurality of first line patterns includes removing a portion of the at least one line pattern of the plurality of first line patterns.

11. The device manufacturing method according to claim 10, wherein the plurality of first line patterns are arranged periodically in a third direction crossing the first direction, and a plurality of positions at each of which the portion of the at least one line pattern of the plurality of first line patterns has been removed are aperiodically arranged in the first direction.

12. The device manufacturing method according to claim 1, further comprising:
preparing a substrate, and
preparing the first layer on the substrate.

13. A device obtained by a process comprising:
forming, in a first layer on a substrate, a plurality of first line patterns of which longitudinal direction is a first direction; and
forming, in a second layer above the first layer, a plurality of second line patterns of which longitudinal direction is a second direction, and a plurality of third line patterns of which longitudinal direction is the second direction and of which etching characteristic is different from etching characteristic of the plurality of second line patterns, so that at least one edge portion of each of the plurality of second line patterns and at least one edge portion of each of the plurality of third line patterns are adjacent to each other,
wherein, as viewed from a position above the second layer, the at least one edge portion of one of the plurality of second line patterns and the at least one edge portion of one of the plurality of third line patterns which are adjacent to each other are positioned between two line patterns, of the plurality of first line patterns, adjacent to each other.

14. The device according to claim 13, wherein the process further comprises:
forming a first mask layer having an opening which is arranged above at least one line pattern of the plurality of second line patterns and at least one line pattern of the plurality of third line patterns;
removing at least a portion of the plurality of second line patterns via the opening by using a first etchant; and
removing at least a portion of the plurality of third line patterns via the opening by using a second etchant different from the first etchant.

15. The device according to claim 14, wherein the process further comprises forming a second mask layer in a position at which the portion of the plurality of second line patterns has been removed by an etching with the first etchant and/or a position at which the portion of the plurality of third line patterns has been removed by an etching with the second etchant.

16. The device according to claim 15, wherein the process further comprises processing at least one line pattern of the plurality of first line patterns via the second mask layer.

17. The device according to claim 16, wherein a circuit pattern formed on the substrate includes at least a portion of the at least one line pattern of the plurality of first line patterns which has been processed.

* * * * *